(12) United States Patent
Lee et al.

(10) Patent No.: US 8,901,572 B2
(45) Date of Patent: Dec. 2, 2014

(54) SEMICONDUCTOR DEVICE AND METHOD FOR FABRICATING THE SAME

(71) Applicant: Hyundai Motor Company, Seoul (KR)

(72) Inventors: Jong Seok Lee, Suwon-si (KR); Kyoung-Kook Hong, Hwaseong-si (KR); Dae Hwan Chun, Gwangmyung-si (KR); Youngkyun Jung, Seoul (KR)

(73) Assignee: Hyundai Motor Company, Seoul (KR)

( * ) Notice: Subject to any disclaimer, the term of this patent is extended or adjusted under 35 U.S.C. 154(b) by 0 days.

(21) Appl. No.: 14/104,974

(22) Filed: Dec. 12, 2013

(65) Prior Publication Data

US 2014/0183560 A1 Jul. 3, 2014

(30) Foreign Application Priority Data

Dec. 27, 2012 (KR) .................. 10-2012-0155373

(51) Int. Cl.
| | |
|---|---|
| *H01L 21/00* | (2006.01) |
| *H01L 29/78* | (2006.01) |
| *H01L 29/10* | (2006.01) |
| *H01L 29/66* | (2006.01) |

(52) U.S. Cl.
CPC ........ *H01L 29/7827* (2013.01); *H01L 29/1037* (2013.01); *H01L 29/66666* (2013.01)
USPC .............. 257/77; 257/330; 438/270; 438/268

(58) Field of Classification Search
USPC .............................. 257/77, 330; 438/270, 268
See application file for complete search history.

(56) References Cited

U.S. PATENT DOCUMENTS

| | | | | |
|---|---|---|---|---|
| 6,410,958 | B1 * | 6/2002 | Usui et al. ...................... | 257/329 |
| 6,740,931 | B2 * | 5/2004 | Kouzuki et al. ............... | 257/341 |
| 7,224,022 | B2 * | 5/2007 | Tokano et al. ................ | 257/328 |
| 7,723,783 | B2 * | 5/2010 | Saito et al. ..................... | 257/330 |
| 8,390,060 | B2 * | 3/2013 | Darwish et al. ................ | 257/330 |
| 8,586,434 | B1 * | 11/2013 | Jung et al. ..................... | 438/268 |
| 8,772,112 | B1 * | 7/2014 | Chun et al. .................... | 438/270 |
| 8,829,608 | B2 * | 9/2014 | Saito et al. ..................... | 257/331 |
| 2002/0063259 | A1 * | 5/2002 | Usui et al. ..................... | 257/110 |
| 2004/0012038 | A1 * | 1/2004 | Kouzuki et al. ............... | 257/200 |
| 2006/0138536 | A1 * | 6/2006 | Kouzuki et al. ............... | 257/341 |
| 2006/0216896 | A1 * | 9/2006 | Saito et al. ..................... | 438/270 |

(Continued)

FOREIGN PATENT DOCUMENTS

| | | |
|---|---|---|
| JP | 07-007154 A | 1/1995 |
| JP | 2002-164540 A | 6/2002 |
| JP | 2003-309261 A | 10/2003 |

*Primary Examiner* — Laura Menz
(74) *Attorney, Agent, or Firm* — McDermott Will & Emery LLP

(57) ABSTRACT

A semiconductor device includes an n+ type silicon carbide substrate; a plurality of n type pillar regions, a plurality of p type pillar regions, and an n− type epitaxial layer disposed on a first surface of the n+ type silicon carbide substrate; a p type epitaxial layer and an n+ region sequentially disposed on the n− type epitaxial layer; a trench penetrating the n+ region and the p type epitaxial layer and disposed on the n− type epitaxial layer; a gate insulating film disposed within the trench; a gate electrode disposed on the gate insulating film; an oxide film disposed on the gate electrode; a source electrode disposed on the p type epitaxial layer, the n+ region, and the oxide film; and a drain electrode positioned on a second surface of the n+ type silicon carbide substrate.

10 Claims, 10 Drawing Sheets

(56) References Cited

U.S. PATENT DOCUMENTS

| | | | |
|---|---|---|---|
| 2007/0018243 A1* | 1/2007 | Ono et al. | 257/330 |
| 2007/0114602 A1* | 5/2007 | Saito et al. | 257/330 |
| 2008/0017897 A1* | 1/2008 | Saito et al. | 257/288 |
| 2010/0308399 A1* | 12/2010 | Saito et al. | 257/329 |
| 2012/0012929 A1* | 1/2012 | Saito et al. | 257/335 |
| 2012/0098055 A1* | 4/2012 | Darwish et al. | 257/330 |
| 2014/0054684 A1* | 2/2014 | Darwish et al. | 257/330 |
| 2014/0077225 A1* | 3/2014 | Lee et al. | 257/77 |
| 2014/0097447 A1* | 4/2014 | Lee et al. | 257/77 |
| 2014/0117379 A1* | 5/2014 | Jung et al. | 257/77 |
| 2014/0167071 A1* | 6/2014 | Lee et al. | 257/77 |
| 2014/0167072 A1* | 6/2014 | Chun et al. | 257/77 |
| 2014/0170824 A1* | 6/2014 | Jung et al. | 438/270 |
| 2014/0183556 A1* | 7/2014 | Lee et al. | 257/77 |
| 2014/0183558 A1* | 7/2014 | Lee et al. | 257/77 |
| 2014/0183559 A1* | 7/2014 | Lee et al. | 257/77 |
| 2014/0183560 A1* | 7/2014 | Lee et al. | 257/77 |
| 2014/0187004 A1* | 7/2014 | Chun et al. | 438/270 |
| 2014/0264562 A1* | 9/2014 | Cheng et al. | 257/330 |
| 2014/0264563 A1* | 9/2014 | Cheng et al. | 257/330 |

\* cited by examiner

SEMICONDUCTOR DEVICE AND METHOD FOR FABRICATING THE SAME

CROSS-REFERENCE TO RELATED APPLICATION

This application claims priority to and the benefit of Korean Patent Application No. 10-2012-0155373 filed in the Korean Intellectual Property Office on Dec. 27, 2012, the entire contents of which are incorporated herein by reference.

BACKGROUND

1. Technical Field

The present disclosure relates to a semiconductor device including silicon carbide (SiC) and a method for fabricating the same.

2. Background

With the recent trend toward large-sized and large-capacity application apparatuses, a power semiconductor device having high breakdown voltage, high current capacity, and high-speed switching characteristics has become necessary.

Accordingly, a great deal of research and development is being conducted on MOSFETs (metal oxide semiconductor field effect transistors) using silicon carbide (SiC), instead of conventional MOSFETs using silicon. Particularly, there is a lot of development of vertical trench MOSFETs.

In the case of a vertical trench MOSFET, breakdown may occur which can damage an oxide film due to an electric field concentration effect by which an electric field is concentrated at the bottom of a gate. This causes a premature breakdown which exhibits a breakdown voltage much lower than a breakdown voltage caused by the intrinsic threshold voltage of a raw material of the MOSFET.

The above information disclosed in this Background section is only for enhancement of understanding of the background of the disclosure.

SUMMARY

The present disclosure has been made in an effort to improve the breakdown voltage of a silicon carbide MOSFET using a trench gate and reduce the on-resistance thereof.

An exemplary embodiment of the present disclosure provides a semiconductor device including: an n+ type silicon carbide substrate; a plurality of n type pillar regions, a plurality of p type pillar regions, and an n− type epitaxial layer disposed on a first surface of the n+ type silicon carbide substrate; a p type epitaxial layer and an n+ region sequentially disposed on the n− type epitaxial layer; a trench penetrating the n+ region and the p type epitaxial layer and disposed on the n− type epitaxial layer; a gate insulating film disposed within the trench; a gate electrode disposed on the gate insulating film; an oxide film disposed on the gate electrode; a source electrode disposed on the p type epitaxial layer, the n+ region, and the oxide film; and a drain electrode positioned on a second surface of the n+ type silicon carbide substrate opposite the first surface, wherein a first p type pillar region of the plurality of p type pillar regions is disposed within the n− type epitaxial layer, and the n type pillar regions and the p type pillar regions are spaced apart from the trench, and are not disposed in an area corresponding to the bottom of the trench.

The n type pillar regions and the p type pillar regions may alternate with each other.

The n type pillar regions and the p type pillar regions may be in contact with each other.

The n type pillar regions and the p type pillar regions may have the same thickness.

An exemplary embodiment of the present disclosure provides a method for fabricating a semiconductor device, the method including: forming a first buffer layer pattern on a first surface of an n+ type silicon carbide substrate to expose a first portion of the first surface of the n+ type silicon carbide substrate; forming a plurality of n type pillar regions by first epitaxial growth on the first portion of the first surface of the n+ type silicon carbide substrate; removing the first buffer layer pattern and then forming a second buffer layer pattern exposing a second portion of the first surface of the n+ type silicon carbide substrate, the second portion being adjacent to the first portion of the first surface of the n+ type silicon carbide substrate; forming a plurality of p type pillar regions by second epitaxial growth on the second portion of the first surface of the n+ type silicon carbide substrate; removing the second buffer layer pattern to expose a third portion of the first surface of the n+ type silicon carbide substrate, the third portion being positioned in between the second portion of the first surface of the n+ type silicon substrate; forming an n− type epitaxial layer by third epitaxial growth on the third portion of the first surface of the n+ type silicon carbide substrate, the n type pillar regions, and the p type pillar regions; forming a p type epitaxial layer by fourth epitaxial growth on the n− type epitaxial layer; forming an n+ region by fifth epitaxial growth on the p type epitaxial layer; and forming a trench by penetrating the n+ region and the p type epitaxial layer and etching part of the n− type epitaxial layer, wherein the trench is formed in an area corresponding to the third portion of the first surface of the n+ type silicon carbide substrate, and the n type pillar regions and the p type pillar regions are spaced apart from the trench but not formed on the third portion of the first surface of the n+ type silicon carbide substrate.

In the forming of a second buffer layer pattern, a second buffer layer pattern may be formed on the n type pillar regions and on the third portion of the first surface of the n+ type silicon carbide substrate.

The method for fabricating a semiconductor device according to the exemplary embodiment of the present disclosure may further include: after the forming of an n+ region, forming a gate insulating film within the trench; forming a gate electrode on the gate insulating film; forming an oxide film on the gate insulating film and the gate electrode; and forming a source electrode on the p type epitaxial layer, the n+ region, and the oxide film and forming a drain electrode on the second surface of the n+ type silicon carbide substrate.

According to an exemplary embodiment of the present disclosure, as the n type pillar regions and the p type pillar regions, spaced apart from the trench and being in contact with each other, are disposed within the n− type epitaxial layer, an electric field concentrated on the gate insulating film spreads by a PN junction between the p type pillar regions and the n− type epitaxial layer. As a result, the breakdown voltage can be improved.

Moreover, the n type pillar regions and the p type pillar regions are not disposed in the area corresponding to the bottom of the trench, and this provides a path through which electrons and current move to the drain electrode. Thus, the on-resistance of the semiconductor device can be reduced.

DETAILED DESCRIPTION

Figure 1:
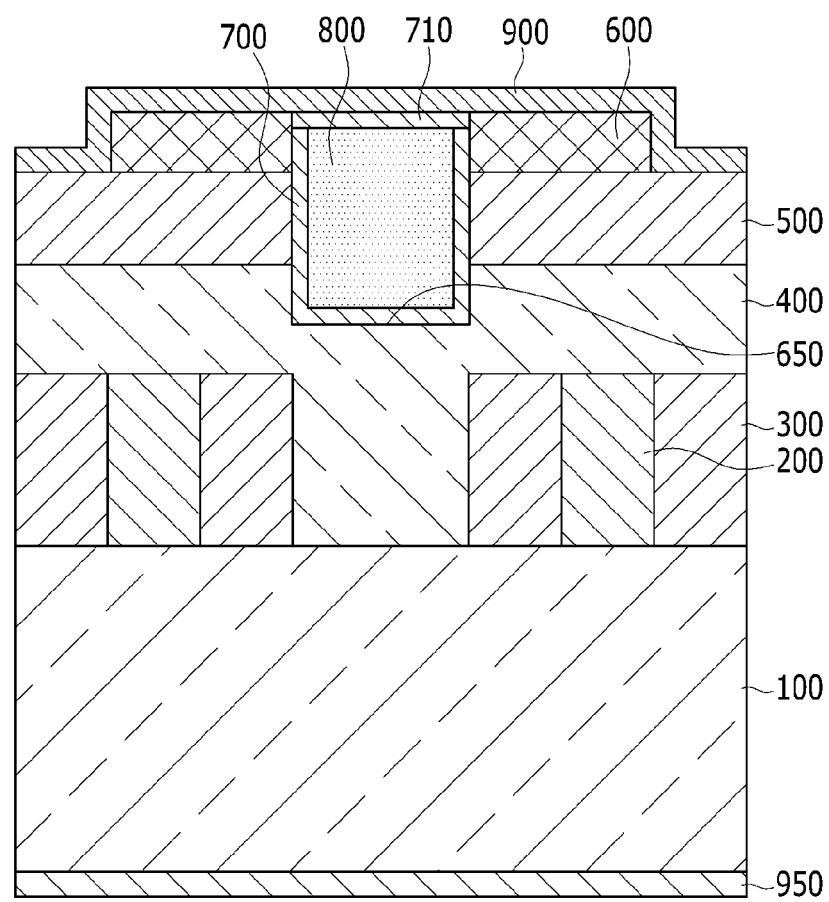
FIG. 1 is a cross-sectional view of a semiconductor device according to an exemplary embodiment of the present disclosure.

Exemplary embodiments of the present disclosure will be described in detail with reference to the attached drawings. The present disclosure may be modified in many different forms and should not be construed as being limited to the exemplary embodiments set forth herein. Rather, the exemplary embodiments of the present disclosure are provided so that this disclosure will be thorough and complete, and will fully convey the concept of the present disclosure to those skilled in the art.

In the drawings, the thickness of layers and regions may be exaggerated for clarity. In addition, when a layer is described to be formed on another layer or on a substrate, this means that the layer may be formed on the other layer or on the substrate, or a third layer may be interposed between the layer and the other layer or the substrate. Like numbers refer to like elements throughout the specification.

FIG. 1 is a cross-sectional view of a semiconductor device according to an exemplary embodiment of the present disclosure.

Referring to FIG. 1, the semiconductor device according to an exemplary embodiment has a plurality of n type pillar regions 200, a plurality of p type pillar regions 300, and an n− type epitaxial layer 400 disposed on a first surface of an n+ type silicon carbide substrate 100.

A p type epitaxial layer 500 and an n+ region 600 may be sequentially disposed on the n− type epitaxial layer 400.

A trench 650 may be disposed in the n− type epitaxial layer 400, the p type epitaxial layer 500, and the n+ region 600. The trench 650 may penetrate the n+ region 600 and the p type epitaxial layer 500.

The n type pillar regions 200 and the p type pillar regions 300 may be in contact with each other, and alternate with each other. The n type pillar regions 200 and the p type pillar regions 300 may be positioned within the n− type epitaxial layer 400, and spaced apart from the p type epitaxial layer 500 and the trench 650. The n type pillar regions 200 and the p type pillar regions 300 may not be disposed in an area corresponding to the bottom of the trench 650.

A gate insulating film 700 may be disposed within the trench 650, a gate electrode 800 disposed on the gate insulating film 700, and an oxide film 710 disposed on the gate insulating film 700 and the gate electrode 800. The gate electrode 800 fills the trench 650.

A source electrode 900 may be formed on the p type epitaxial layer 500, the n+ region 600, and the oxide film 710. A drain electrode 950 may be formed on a second surface of the n+ type silicon carbide substrate 100.

As the n type pillar regions 200 and the p type pillar regions 300, which may be spaced apart from the trench 650 in contact with each other, are disposed within the n− type epitaxial layer 400, an electric field concentrated on the gate insulating film 600 spreads by a PN junction between the n type pillar regions 200 and the p type pillar regions 300. As a result, the breakdown voltage can be improved.

Moreover, the n type pillar regions 200 and the p type pillar regions 300 may not be disposed in the area corresponding to the bottom of the trench 650, thereby providing a path through which electrons and current move to the drain electrode 950. Thus, the on-resistance of the semiconductor device can be reduced.

FIGS. 2 to 9 are views sequentially showing a method for fabricating a semiconductor device according to an exemplary embodiment of the present disclosure.

Figure 2:
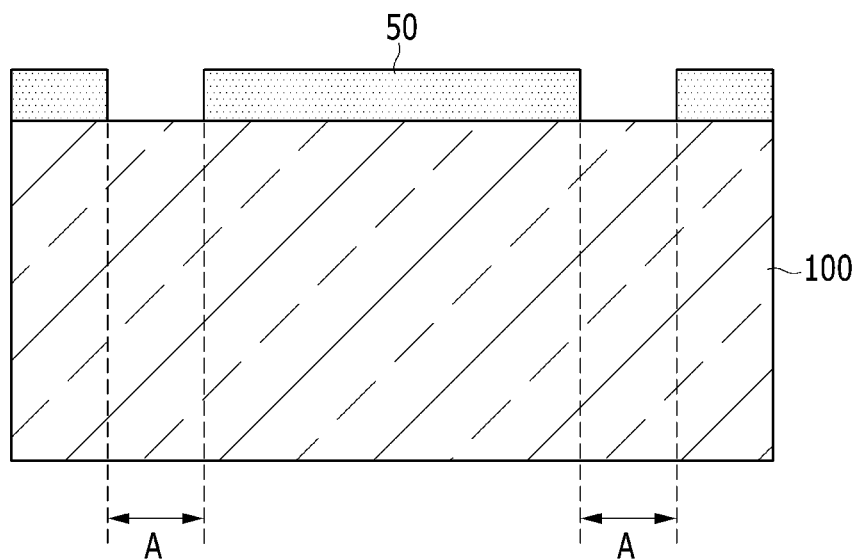
FIG. 2 to FIG. 9 are views sequentially showing a method for fabricating a semiconductor device according to an exemplary embodiment of the present disclosure.

As shown in FIG. 2, an n+ type silicon carbide substrate 100 may be prepared, and a first buffer layer pattern 50 may be formed on a first surface of the n+ type silicon carbide substrate 100. The first buffer layer pattern 50 exposes a first portion A of the first surface of the n+ type silicon carbide substrate 100.

Figure 3:
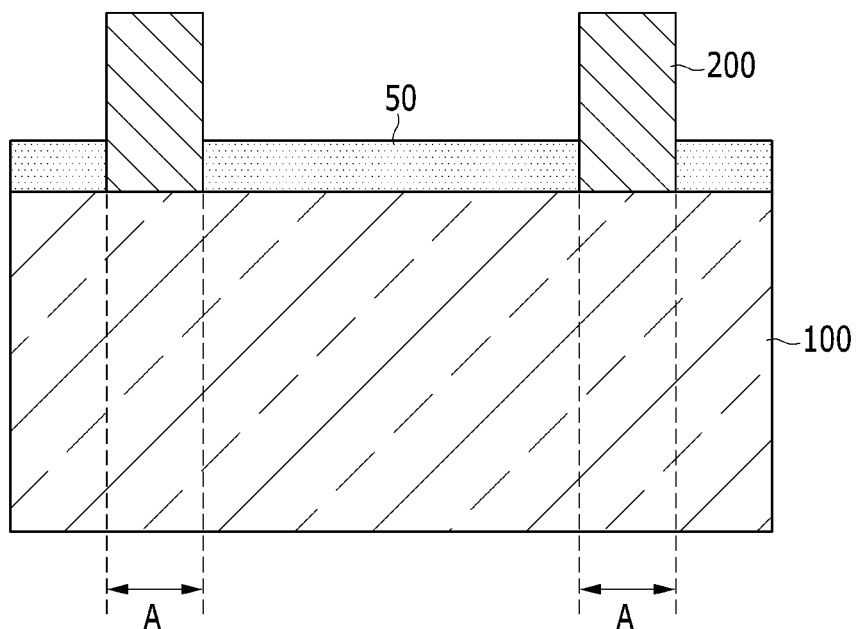

As shown in FIG. 3, a plurality of n type pillar regions 200 may be formed by a first epitaxial growth on the first portion A of the first surface of the n+ type silicon carbide substrate 100.

Figure 4:
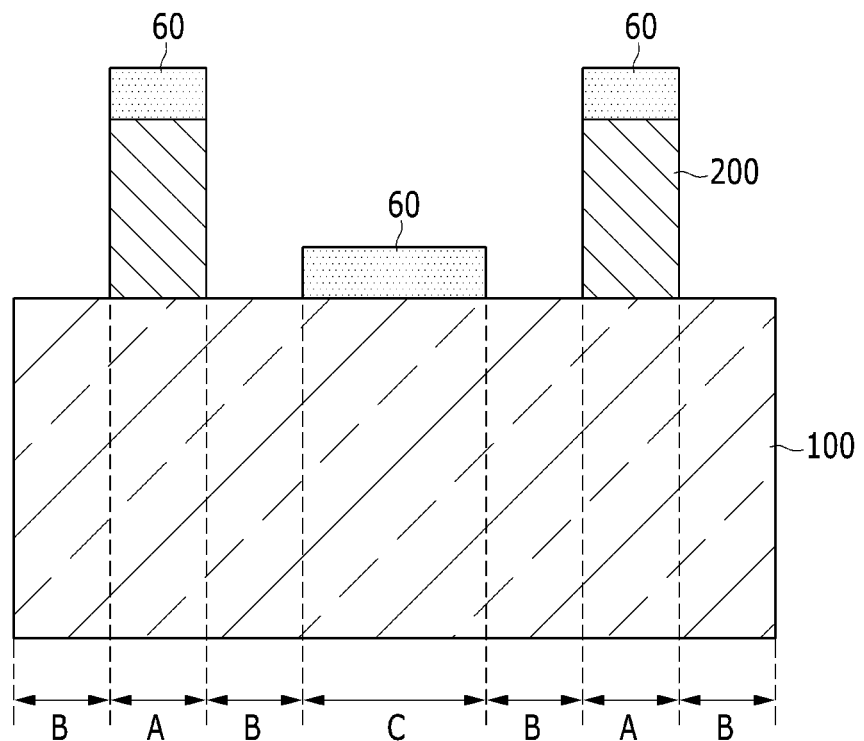

As shown in FIG. 4, the first buffer layer pattern 50 may be removed to expose a second portion B of the first surface of the n+ type silicon carbide substrate 100, and then a second buffer layer pattern 60 is formed on the n type pillar regions 200. At this point, the second buffer layer pattern 60 may be formed on the n type pillar regions 200 and a third portion C of the first surface of the n+ type silicon carbide substrate 100.

The second portion B of the first surface of the n+ type silicon carbide substrate 100 may be adjacent to the first portion A of the first surface of the n+ type silicon carbide substrate 100, and the third portion C of the first surface of the n+ type silicon carbide substrate 100 may be positioned in between the second portion B of the first surface of the n+ type silicon carbide substrate 100.

Figure 5:
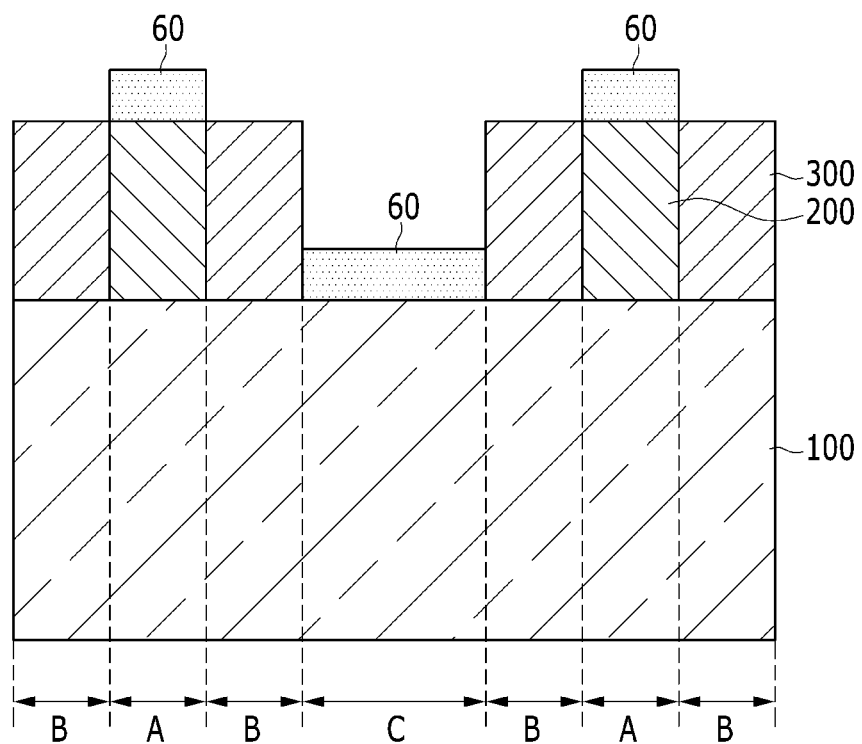

As shown in FIG. 5, a plurality of p type pillar regions 300 may be formed by a second epitaxial growth on the second portion B of the first surface of the n+ type silicon carbide substrate 100. The second epitaxial growth does not occur at the n type pillar regions 200 and the third portion C of the first surface of the n+ type silicon carbide substrate 100 due to the second buffer layer pattern 60. The p type pillar regions 300 and the n type pillar regions 200 may have the same thickness.

Figure 6:
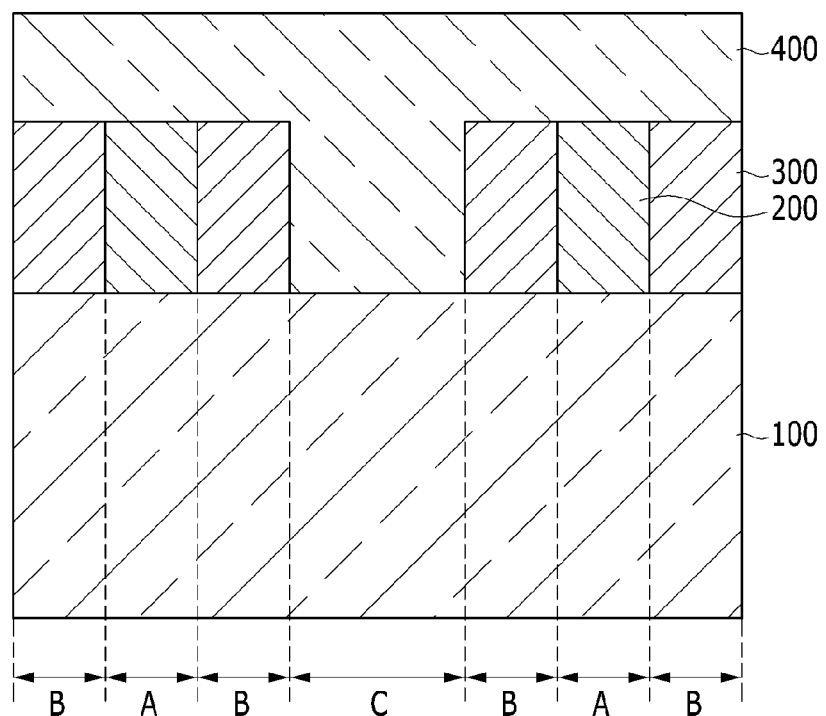

As shown in FIG. 6, the second buffer layer pattern 60 may be removed, and then an n− type epitaxial layer 400 may be formed by third epitaxial growth on the third portion C of the first surface of the n+ type silicon carbide substrate, the n type pillar regions 200, and the p type pillar regions 300. Accordingly, the n type pillar regions 200 and the p type pillar regions 300 may be positioned within the n− type epitaxial layer 400.

Figure 7:
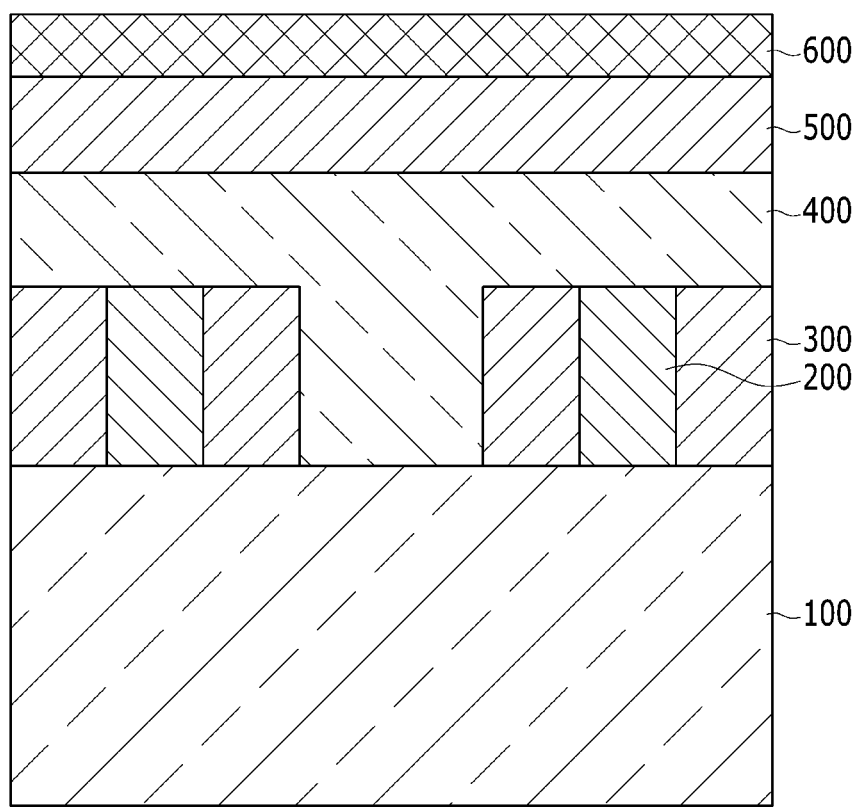

As shown in FIG. 7, a p type epitaxial layer 500 may be formed by a fourth epitaxial growth on the n− type epitaxial layer 400, and an n+ region 600 is formed by fifth epitaxial growth on the p type epitaxial layer 500. The p type epitaxial layer 500 may be spaced apart from the n type pillar regions 200 and the p type pillar regions 300.

Although the n+ region 600 may be formed by the fifth epitaxial growth in the present exemplary embodiment, the n+ region 600 may be formed by implanting n+ ions into part of the surface of the p type epitaxial layer 500, without performing epitaxial growth.

Figure 8:
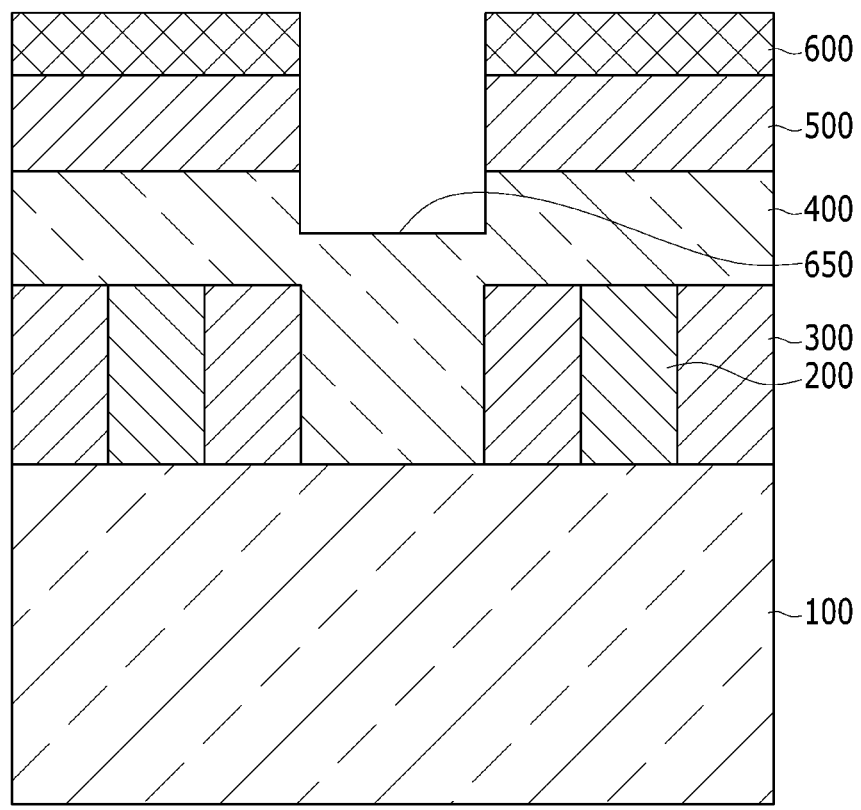

As shown in FIG. 8, a trench 650 may be formed by penetrating the n+ region 600 and the p type epitaxial layer 500 and etching part of the n− type epitaxial layer 400. The n type pillar regions 200 and the p type pillar regions 300 may be spaced apart from the trench 650, and the n type pillar regions 200 and the p type pillar regions 300 not formed below the trench 650. That is, the trench 650 may be formed in an area corresponding to the third portion C of the first surface of the n+ type silicon carbide substrate 100.

Figure 9:
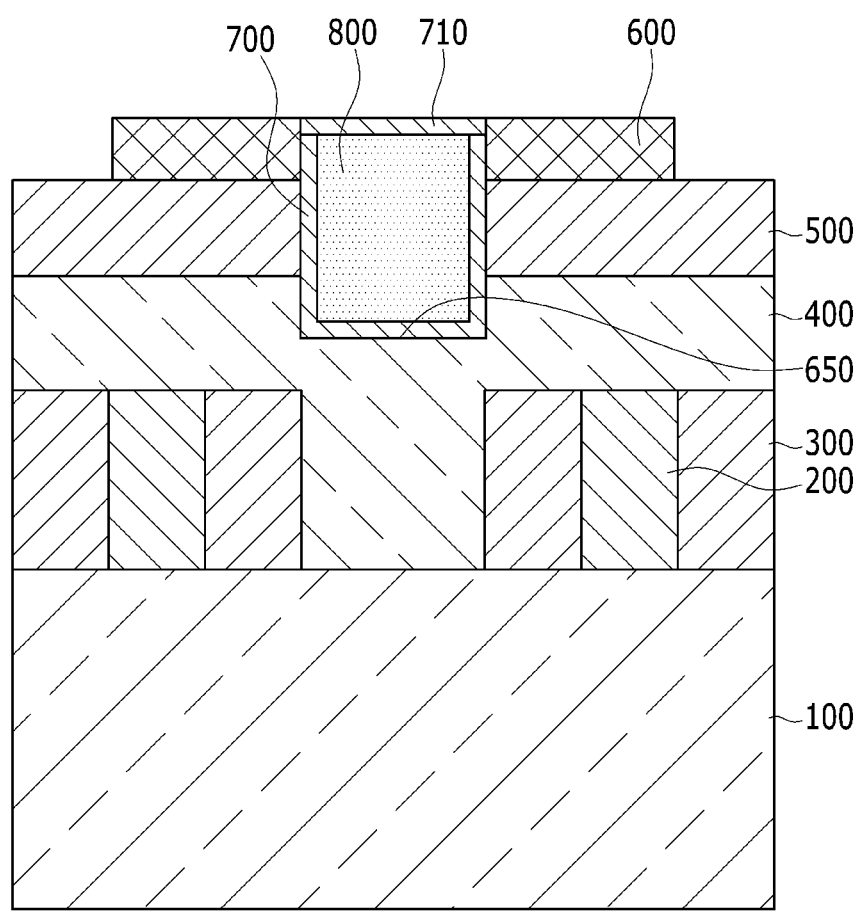

As shown in FIG. 9, a gate insulating film 700 may be formed within the trench 650, and a gate electrode 800 formed on the gate insulating film 700. An oxide film 710 may be formed on the gate insulating film 700 and the gate electrode 800, and part of the n+ region 600 may be etched.

As shown in FIG. 1, a source electrode 900 may be formed on the p type epitaxial layer 500, the n+ region 600, and the oxide film 710, and a drain electrode 950 may be formed on a second surface of the n+ type silicon carbide substrate 100.

Figure 10:
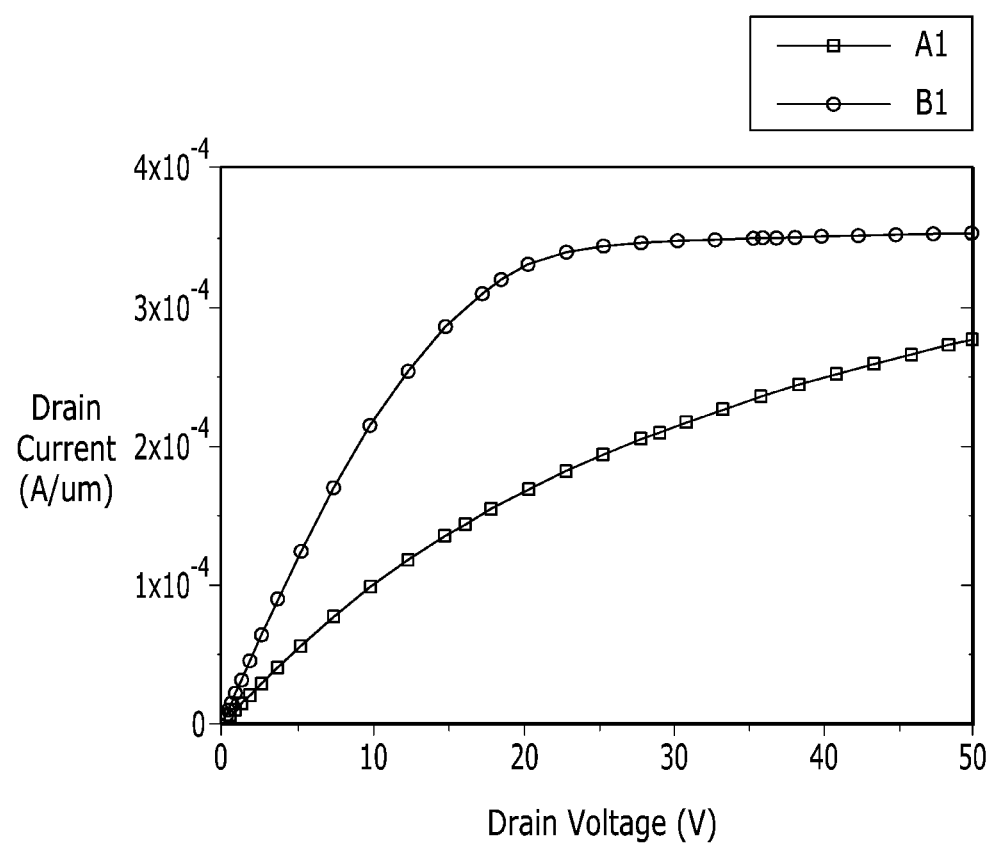
FIG. 10 is a graph comparing the current-voltage characteristics of a semiconductor device according to an exemplary embodiment of the present disclosure with the current-voltage characteristics of a conventional semiconductor device.

FIG. 10 is a graph comparing the current-voltage characteristics of a semiconductor device according to an exemplary embodiment of the present disclosure with the current-voltage characteristics of a conventional semiconductor device.

In FIG. 10, A1 represents a conventional vertical trench MOSFET, and B1 represents a semiconductor device according to an exemplary embodiment of the present disclosure.

Referring to FIG. 10, the amount of current of the semiconductor device according to the exemplary embodiment of the present disclosure is larger than the amount of current of the conventional vertical trench MOSFET. Based upon this, it can be concluded that the on-resistance of the semiconductor according to an exemplary embodiment of the present disclosure is lower than the on-resistance of the conventional semiconductor device.

While this disclosure has been described in connection with what is presently considered to be practical exemplary embodiments, it is to be understood that the disclosure is not limited to the disclosed embodiments, but, on the contrary, is intended to cover various modifications and equivalent arrangements included within the spirit and scope of the appended claims.

What is claimed is:

1. A semiconductor device comprising:
   an n+ type silicon carbide substrate;
   a plurality of n type pillar regions, a plurality of p type pillar regions, and an n− type epitaxial layer disposed on a first surface of the n+ type silicon carbide substrate;
   a p type epitaxial layer and an n+ region sequentially disposed on the n− type epitaxial layer;
   a trench penetrating the n+ region and the p type epitaxial layer and disposed on the n− type epitaxial layer;
   a gate insulating film disposed within the trench;
   a gate electrode disposed on the gate insulating film;
   an oxide film disposed on the gate electrode;
   a source electrode disposed on the p type epitaxial layer, the n+ region, and the oxide film; and
   a drain electrode positioned on a second surface of the n+ type silicon carbide substrate opposite the first surface,
   wherein a first p type pillar region of the plurality of p type pillar regions is disposed within the n− type epitaxial layer, and
   the n type pillar regions and the p type pillar regions are spaced apart from the trench, and are not disposed in an area corresponding to the bottom of the trench.

2. The semiconductor device of claim 1, wherein the n type pillar regions and the p type pillar regions alternate with each other.

3. The semiconductor device of claim 2, wherein the n type pillar regions and the p type pillar regions are in contact with each other.

4. The semiconductor device of claim 3, wherein the n type pillar regions and the p type pillar regions have the same thickness.

5. A method for fabricating a semiconductor device, the method comprising:

forming a first buffer layer pattern on a first surface of an n+ type silicon carbide substrate to expose a first portion of the first surface of the n+ type silicon carbide substrate;

forming a plurality of n type pillar regions by a first epitaxial growth on the first portion of the first surface of the n+ type silicon carbide substrate;

removing the first buffer layer pattern and then forming a second buffer layer pattern exposing a second portion of the first surface of the n+ type silicon carbide substrate, the second portion being adjacent to the first portion of the first surface of the n+ type silicon carbide substrate;

forming a plurality of p type pillar regions by a second epitaxial growth on the second portion of the first surface of the n+ type silicon carbide substrate;

removing the second buffer layer pattern to expose a third portion of the first surface of the n+ type silicon carbide substrate, the third portion being positioned in between the second portion of the first surface of the n+ type silicon substrate;

forming an n− type epitaxial layer by a third epitaxial growth on the third portion of the first surface of the n+ type silicon carbide substrate, the n type pillar regions, and the p type pillar regions;

forming a p type epitaxial layer by a fourth epitaxial growth on the n− type epitaxial layer;

forming an n+ region by a fifth epitaxial growth on the p type epitaxial layer; and forming a trench by penetrating the n+ region and the p type epitaxial layer and etching part of the n− type epitaxial layer, wherein the trench is formed in an area corresponding to the third portion of the first surface of the n+ type silicon carbide substrate, and the n type pillar regions and the p type pillar regions are spaced apart from the trench but not formed on the third portion of the first surface of the n+ type silicon carbide substrate.

6. The method of claim 5, wherein the n type pillar regions and the p type pillar regions alternate with each other.

7. The method of claim 6, wherein the n type pillar regions and the p type pillar regions are in contact with each other.

8. The method of claim 7, wherein the n type pillar regions and the p type pillar regions have the same thickness.

9. The method of claim 5, wherein, in the forming of a second buffer layer pattern, a second buffer layer pattern is formed on the n type pillar regions and on the third portion of the first surface of the n+ type silicon carbide substrate.

10. The method of claim 5, further comprising:
    after the forming of an n+ region, forming a gate insulating film within the trench;
    forming a gate electrode on the gate insulating film;
    forming an oxide film on the gate insulating film and the gate electrode;
    forming a source electrode on the p type epitaxial layer, the n+ region, and the oxide film; and
    forming a drain electrode on the second surface of the n+ type silicon carbide substrate.

* * * * *